United States Patent [19]
Wu et al.

[11] Patent Number: 5,475,919
[45] Date of Patent: Dec. 19, 1995

[54] PCMCIA CARD MANUFACTURING PROCESS

[75] Inventors: Michael Wu; Hank Wang, both of Hsin Chu, Taiwan

[73] Assignee: Three View Technology Co., Ltd., Hsin Chu, Taiwan

[21] Appl. No.: 319,517

[22] Filed: Oct. 7, 1994

[51] Int. Cl.⁶ ..................................................... H05K 3/30
[52] U.S. Cl. ........................... 29/841; 361/716; 361/719; 361/720; 361/721
[58] Field of Search ............................. 29/841; 361/719, 361/721, 720, 716

[56] References Cited

U.S. PATENT DOCUMENTS

| | | | |
|---|---|---|---|
| 4,658,331 | 4/1987 | Berg | 361/719 X |
| 4,811,165 | 3/1989 | Currier et al. | 361/716 |
| 4,974,317 | 12/1990 | Rodriguez, II et al. | 29/841 |
| 5,099,307 | 3/1992 | Go et al. | 29/841 |

*Primary Examiner*—Carl J. Arbes
*Attorney, Agent, or Firm*—Bacon & Thomas

[57] ABSTRACT

A PCMCIA card manufacturing process is disclosed, including the steps of (1) providing a top cover and a bottom cover made of a metal, preferably stainless steel, each of the top cover and bottom cover being provided with a plurality of hooks along two opposite lateral edges, (2) placing the top cover and bottom cover respectively into a first mold and a second mode for injection molding a first frame member on the top cover with the hooks of the top cover embedded in the first frame member and a second frame member on the bottom cover with the hooks of the bottom cover embedded in the second frame member, each of the first and second frame member being provided with at least one notch that match each other to define at least a connector slot, (3) disposing a circuit board between the first and second frame members with the connector thereof received within the connector slot, and (4) jointing the first and second members together, preferably by ultra sonic welding.

5 Claims, 11 Drawing Sheets

PCMCIA CARD MANUFACTURING PROCESS

FIELD OF THE INVENTION

The present invention relates generally to a PCMCIA (Personal Computer Memory Card International Association) card manufacturing process.

BACKGROUND OF THE INVENTION

PCMCIA card is an important parts for computers, especially portable computers. In general, a PCMCIA card comprises a frame sealed by a top cover and a bottom cover to define therein an interior space for receiving a circuit board. Conventionally, a 68 position socket and an input/output connector are provided on the frame to connect to the computer system. Heretofore, the PCMCIA card is made by (1) individually providing the top cover, the bottom cover and the frame, wherein the top and bottom covers are usually made of metal plates, preferably stainless steel plates, and the frame is made of plastic material, and then (2) jointing the top cover and the bottom cover to the frame by fasteners, such as rivets, with the circuit board disposed within the frame. Using rivets to secure the top cover and the bottom cover to the frame may cause several problems. For example, due to the riveting force applied on the covers, the cover members may undergo deformation and reduction of structural strength. This deteriorates the dimension precision and thus may sometimes cause the PCMCIA card so manufactured jammed in the slot inside the computer into which the card in inserted.

Furthermore, the top cover and bottom cover may not be very closely mounted to the frame by using rivet to joint the top cover and bottom cover to the frame so as to cause looseness between the cover members and the frame.

It is therefore desirable to provide a PCMCIA card manufacturing process which does not involve the use of fasteners, such as rivet, so as to eliminate the problems occurring in the prior art.

SUMMARY OF THE INVENTION

The primary object of the present invention is to provide a PCMCIA card manufacturing process which uses injection molding to form the frame and simultaneously joint the top cover and the bottom cover to the frame without using any fasteners so as to eliminate the problems of the prior art process.

In accordance with the present invention, there is provided a PCMCIA card manufacturing process comprising the steps of (1) providing a top cover and a bottom cover made of a metal, preferably stainless steel, each of the top cover and bottom cover being provided with a plurality of hooks along two opposite lateral edges, (2) placing the top cover and bottom cover respectively into a first mold and a second mode for injection molding a first frame member on the top cover with the hooks of the top cover embedded in the first frame member and a second frame member on the bottom cover with the hooks of the bottom cover embedded in the second frame member, each of the first and second frame member being provided with at least one notch that match each other to define at least a connector slot, (3) disposing a circuit board between the first and second frame members with the connector thereof received within the connector slot, and (4) jointing the first and second frame members together, preferably by ultra sonic welding.

BRIEF DESCRIPTION OF THE DRAWINGS

The present invention will be better understood from the following description of preferred embodiments of the present invention, with reference to the attached drawings, wherein.

DETAILED DESCRIPTION OF THE PREFERRED EMBODIMENT

Figure 1:
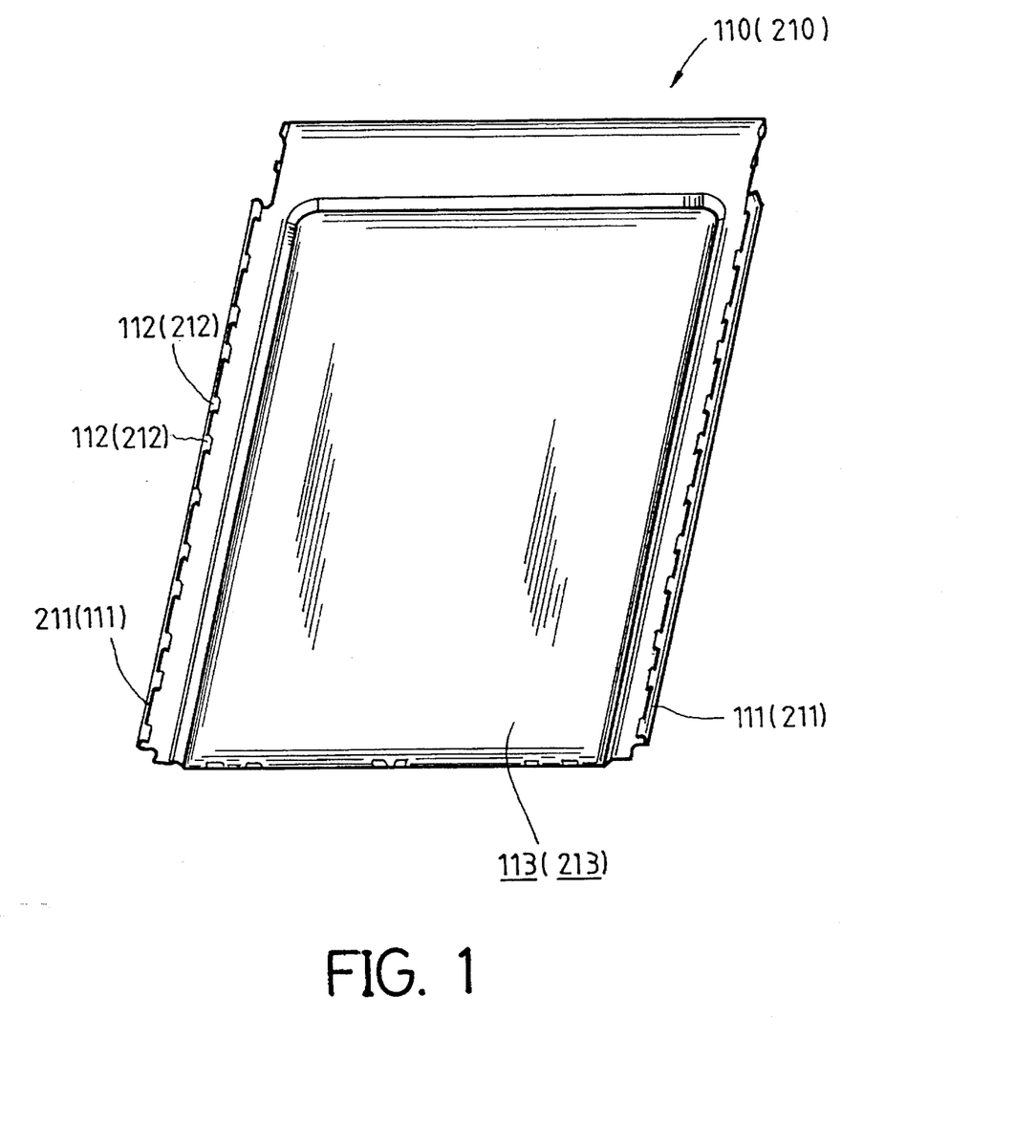
FIG. 1, is a perspective view showing a cover member adapted to be used in the PCMCIA card manufacturing process in accordance with the present invention.
Figure 2:
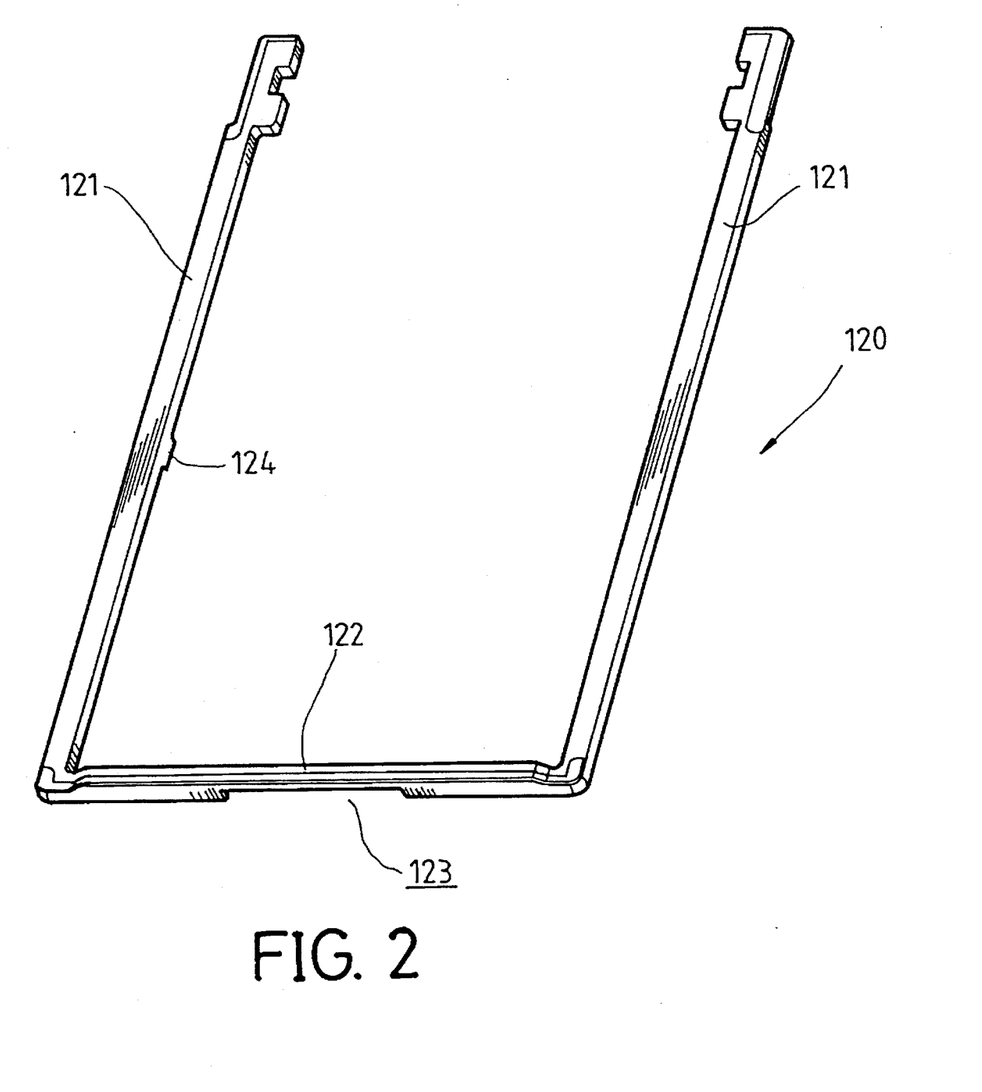
FIGS. 2 and 3 are perspective views of a first frame member and a second frame member, respectively, adapted to be used in the PCMCIA card manufacturing process in accordance with the present invention for manufacturing a single connector PCMCIA card.
Figure 3:
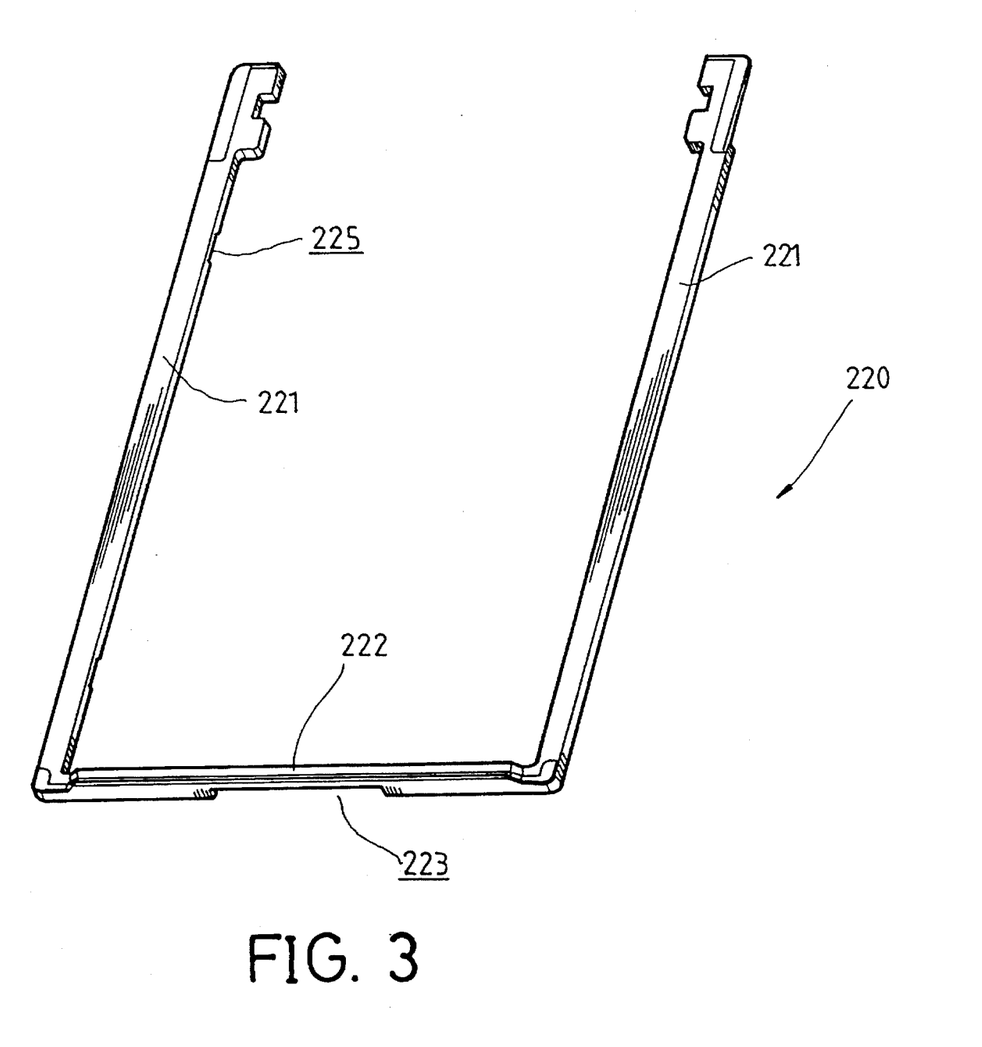
Figure 4:
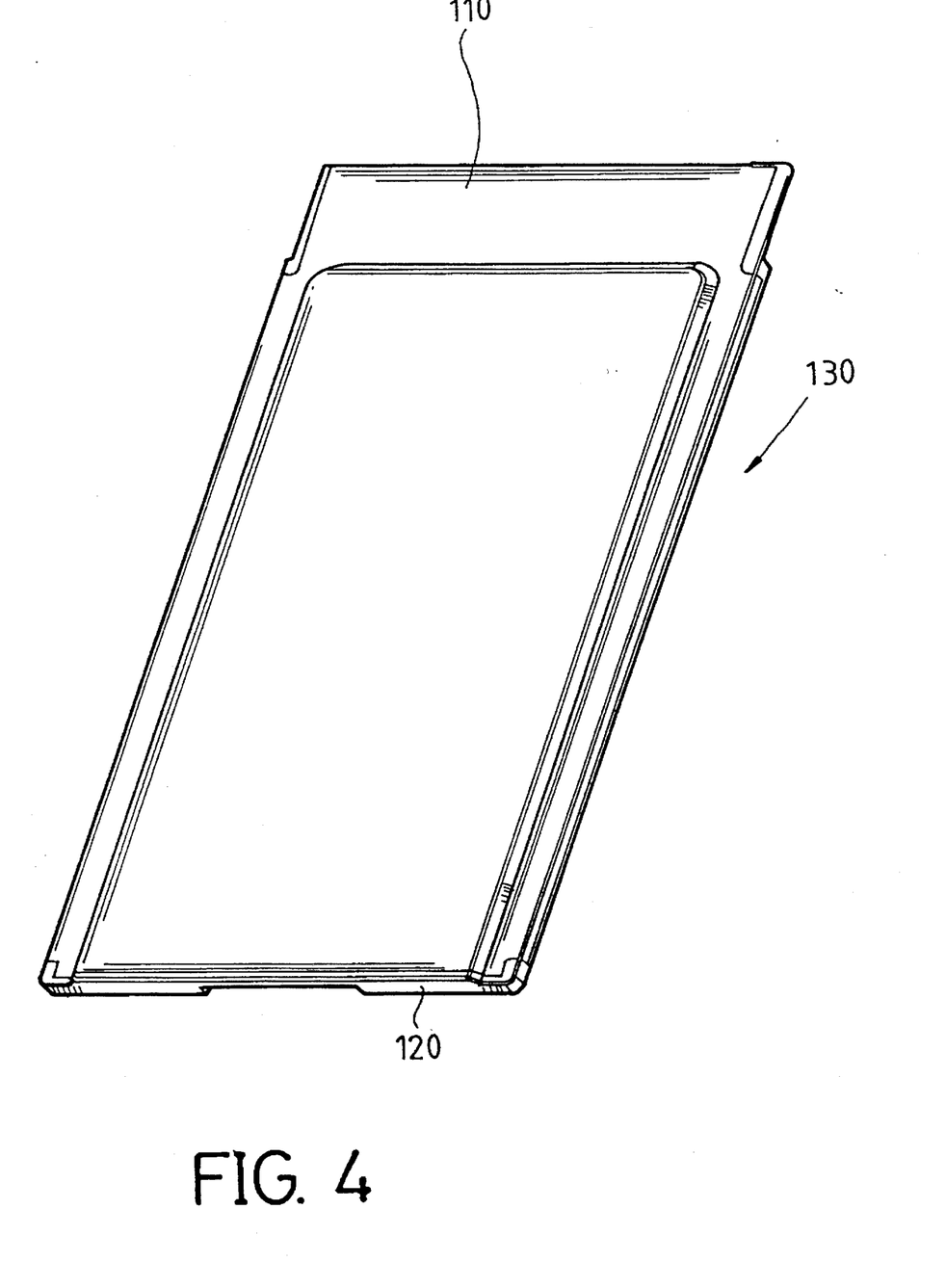
FIGS. 4 and 5 are perspective views of the first and second frame members shown in FIGS. 2 and 3, both having the cover member mounted thereto.
Figure 5:
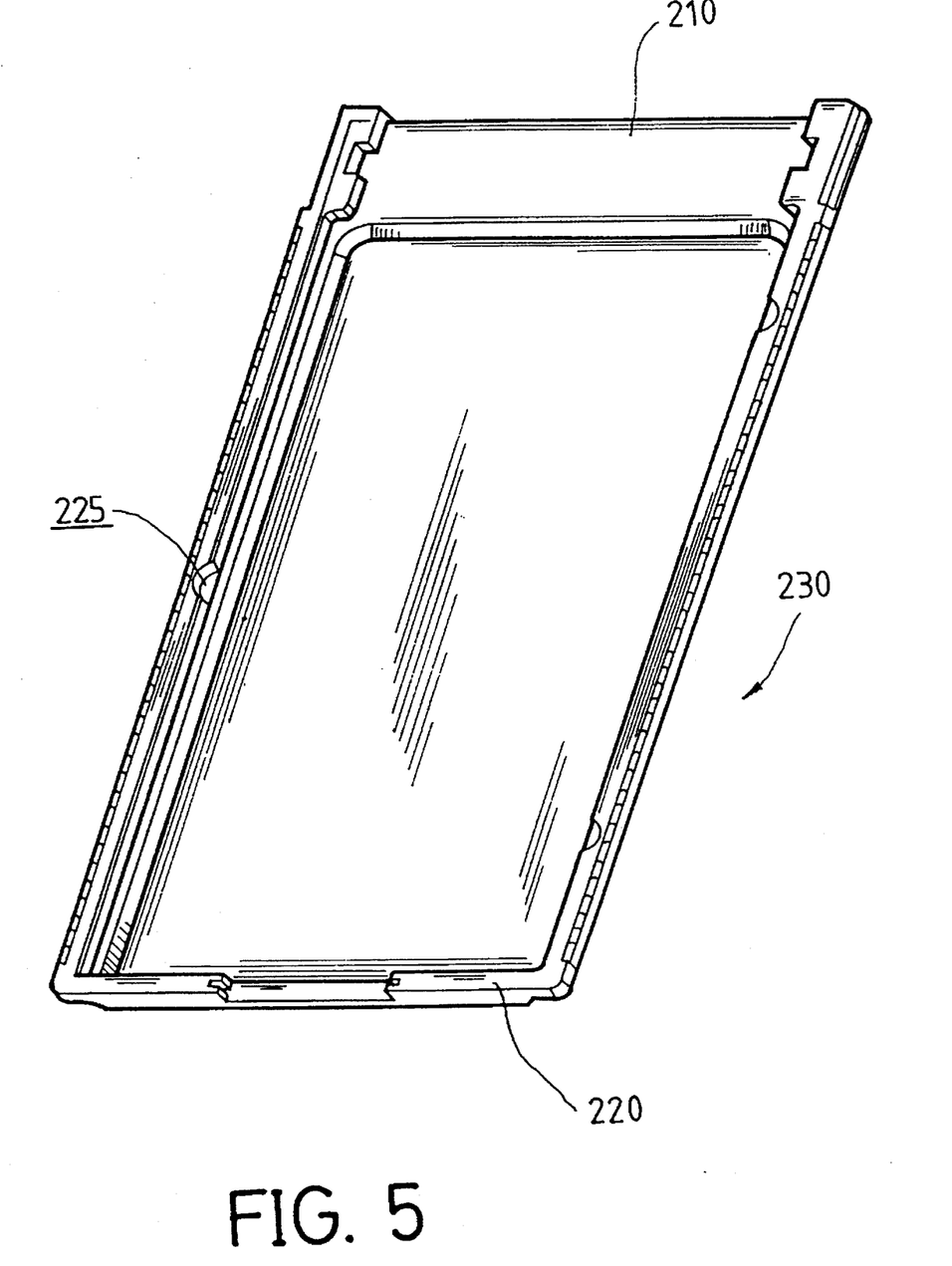
Figure 6:
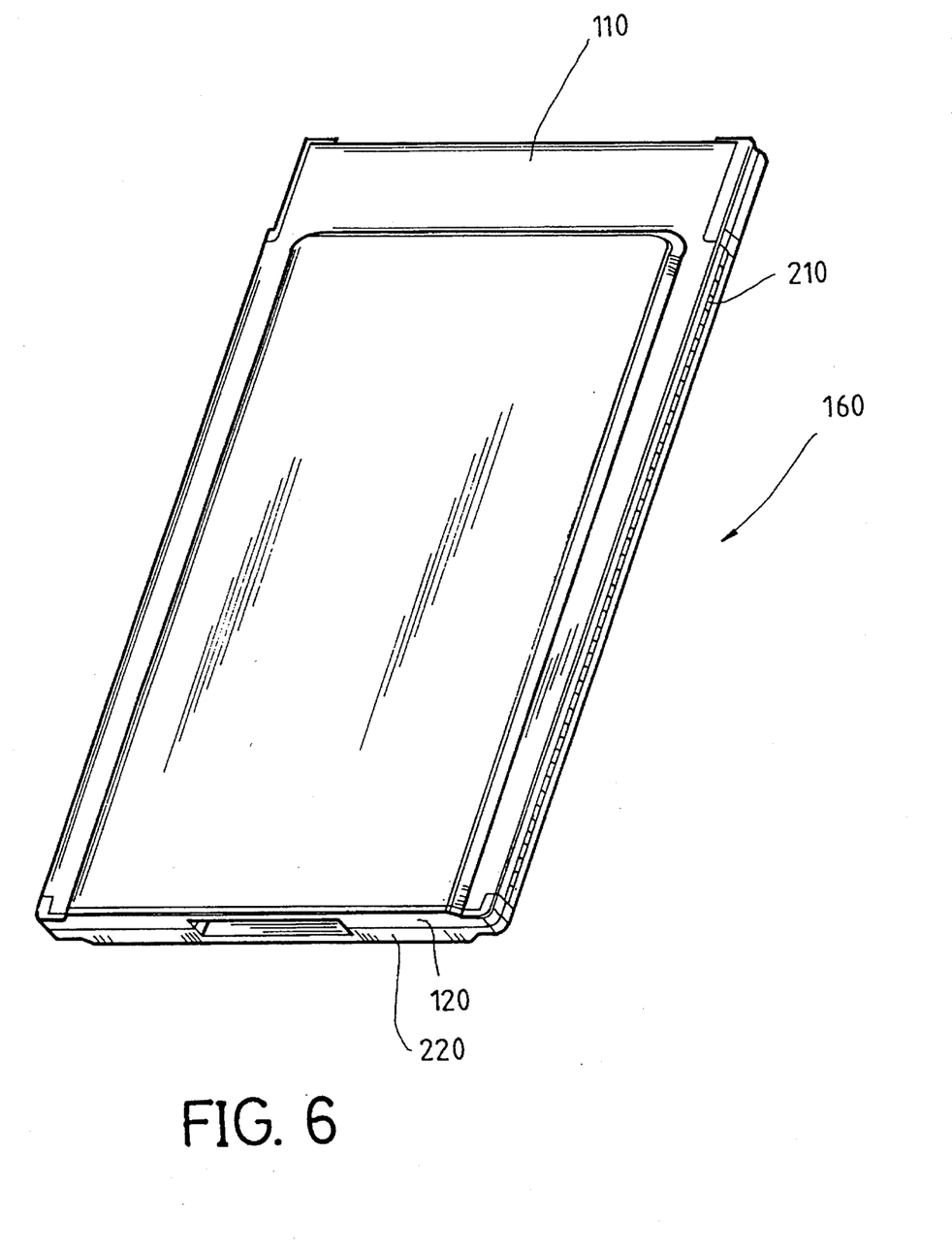
FIG. 6 is a perspective view showing a completed single connector PCMCIA card.

A PCMCIA card manufacturing process is disclosed herein. In accordance with the present invention, the process for manufacturing, for example a single connector type PCMCIA card, comprises the following steps:

(1) forming two identical cover members with metal plates, preferably stainless steel plates, as shown in FIG. 1, a first cover member and a second cover member which will be respectively designated with the reference numerals 110 and 210 in the drawings, each of the cover members 110 and 210 being in the form of a rectangle having two lateral edges on which an edge flange 111 or 211 is formed with a plurality of inward facing hooks 112 or 212 mounted thereto; preferably, each of the cover members has a recessed portion 113 or 213 extending a substantial distance from a front end of the rectangle to a rear end along the lateral edges, the recessed portion being separated from the rear end and the two lateral edges of the rectangle;

(2) Placing the first and second cover members 110 and 210 respectively into a first mold and a second mold (both not shown) to injection mold a first frame member, as shown in FIG. 2 and generally designated with the numeral 120, onto the first cover member 110 and a second frame member, as shown in FIG. 3 and generally designated with the reference numeral 220, onto the second cover member 210, each of the frame members 120 or 220 having a U-shape with two legs 121 or 221 separated a distance suitable to be accommodated between the two edge flanges 111 or 211 of the associated cover member 110 or 210 so as to have the hooks 112 or 212 of the associated cover member 110 or 210 embedded within the legs 121 or 221 during the injection molding process, and thus define a first frame/ cover sub-assembly as shown in FIG. 4 which is designated with the reference numeral 130 and a second frame/cover sub-assembly as shown in FIG. 5 which is designated with the reference numeral 230; each of the U-shaped frame members 120 and 220 comprises a bottom portion 122 or 222 connecting between the two legs 121 or 221 to form the U-shape and each of the bottom portions 122 and 222 has a notch 123 or 223 formed thereon, corresponding to each other; preferably, the first and second frame members 120 and 220 respectively comprise dowel pins 124 and corresponding notches 225 which are engageable with each other;

(3) Disposing a circuit board and associated electronic elements (all not shown in the drawings) between the two sub-assemblies 130 and 230, with a single connector which is generally a 15 pin connector electrically connected to the circuit board received within the notches 123 and 223; and (4) Mating the first and second sub-assemblies 130 and 230 together by having the dowel pins 124 received within the associated notches 225 to have the notches 123 and 223 that are formed on the bottom portions 122 and 222 of the U-shaped members 120 and 220 match each other to define a single connector slot for receiving and retaining the connector therein and securing the two sub-assemblies 130 and 230 together by means of ultra sonic welding or the like to form the completed PCMCIA card 160, as shown in FIG. 6.

Figure 7:
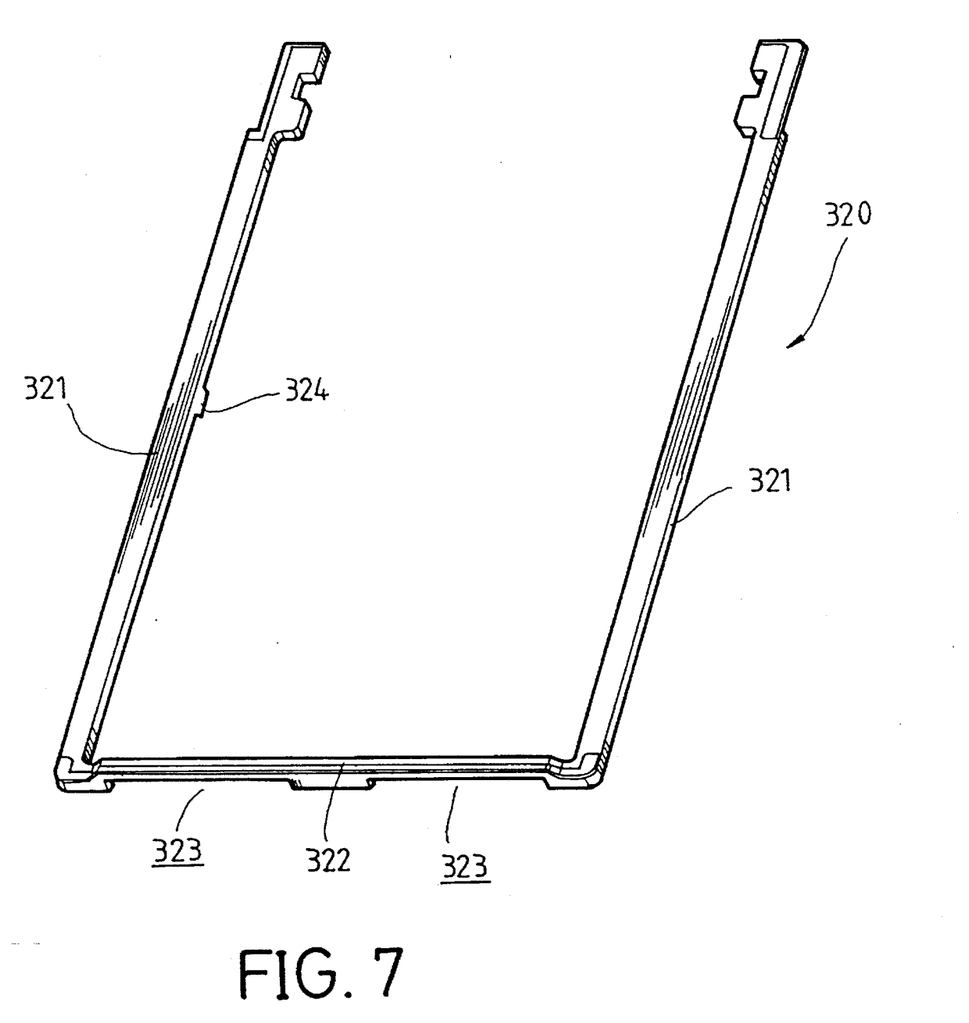
FIGS. 7 and 8 are perspective views of a first frame member and a second frame member, respectively, adapted to be used in the PCMCIA card manufacturing process in accordance with the present invention for manufacturing a dual connector PCMCIA card.
Figure 8:
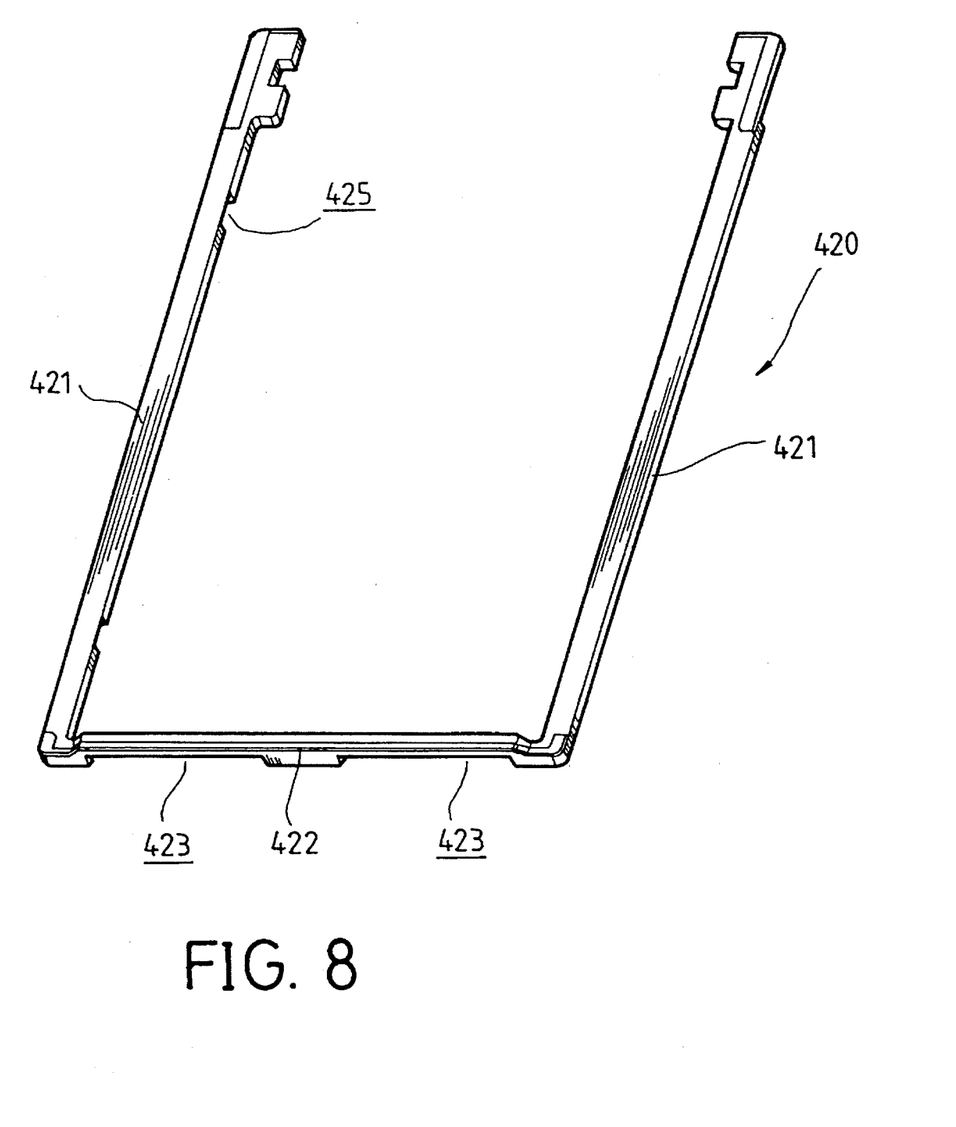
Figure 9:
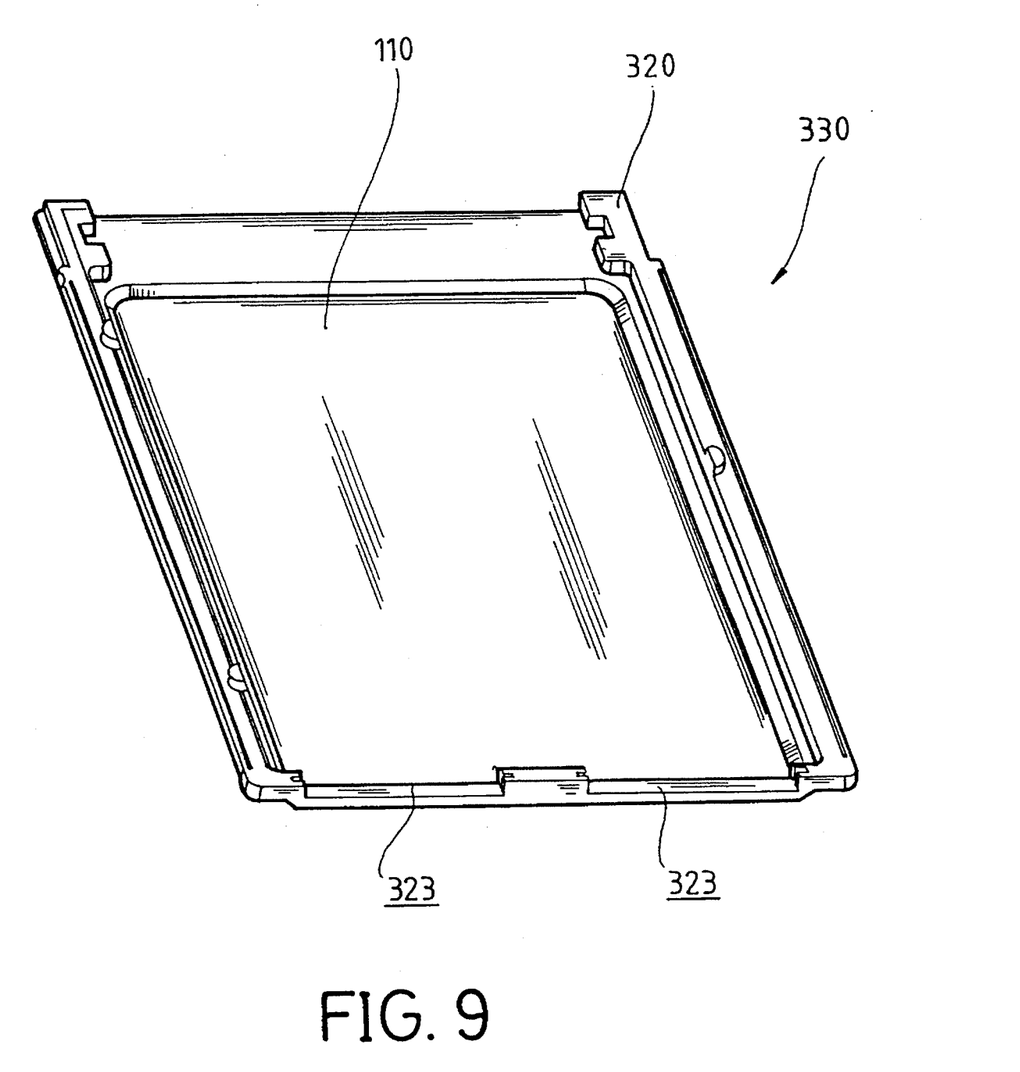
FIGS. 9 and 10 are perspective views of the first and second frame members shown in FIGS. 7 and 8, both having the cover member of FIG. 1 mounted thereto.
Figure 10:
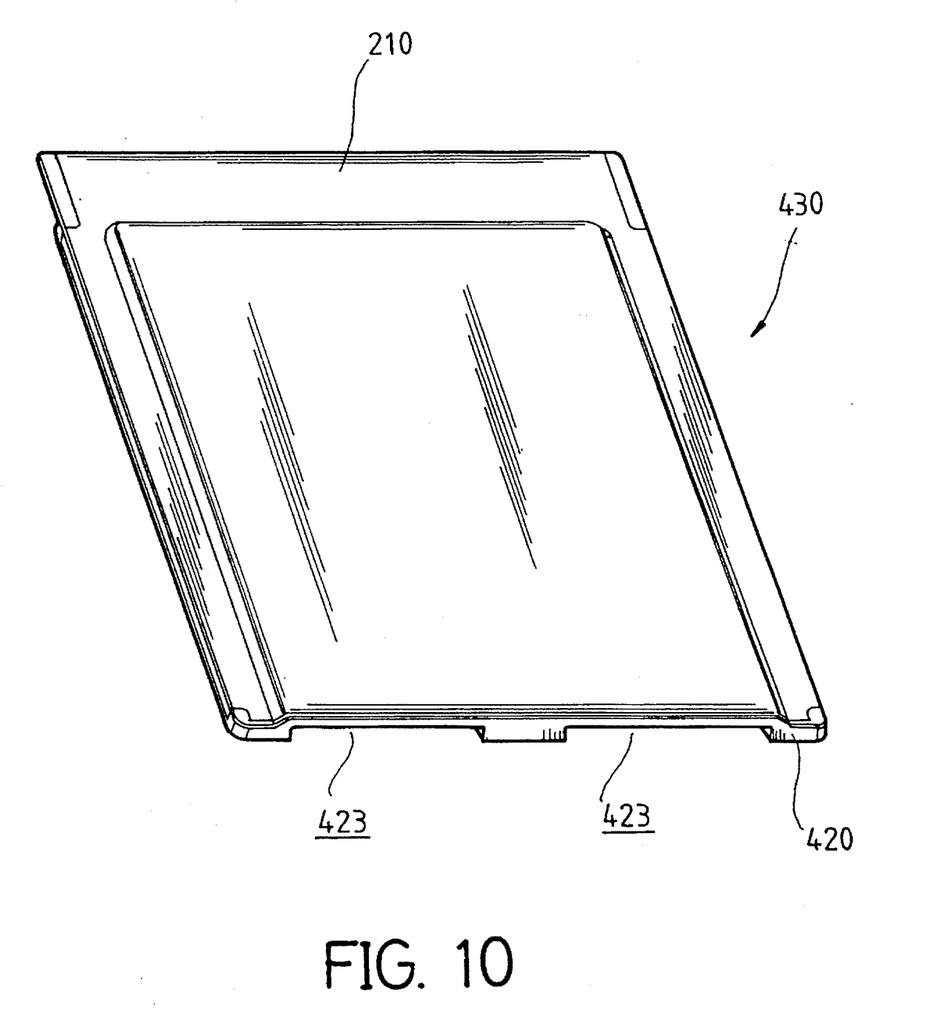
Figure 11:
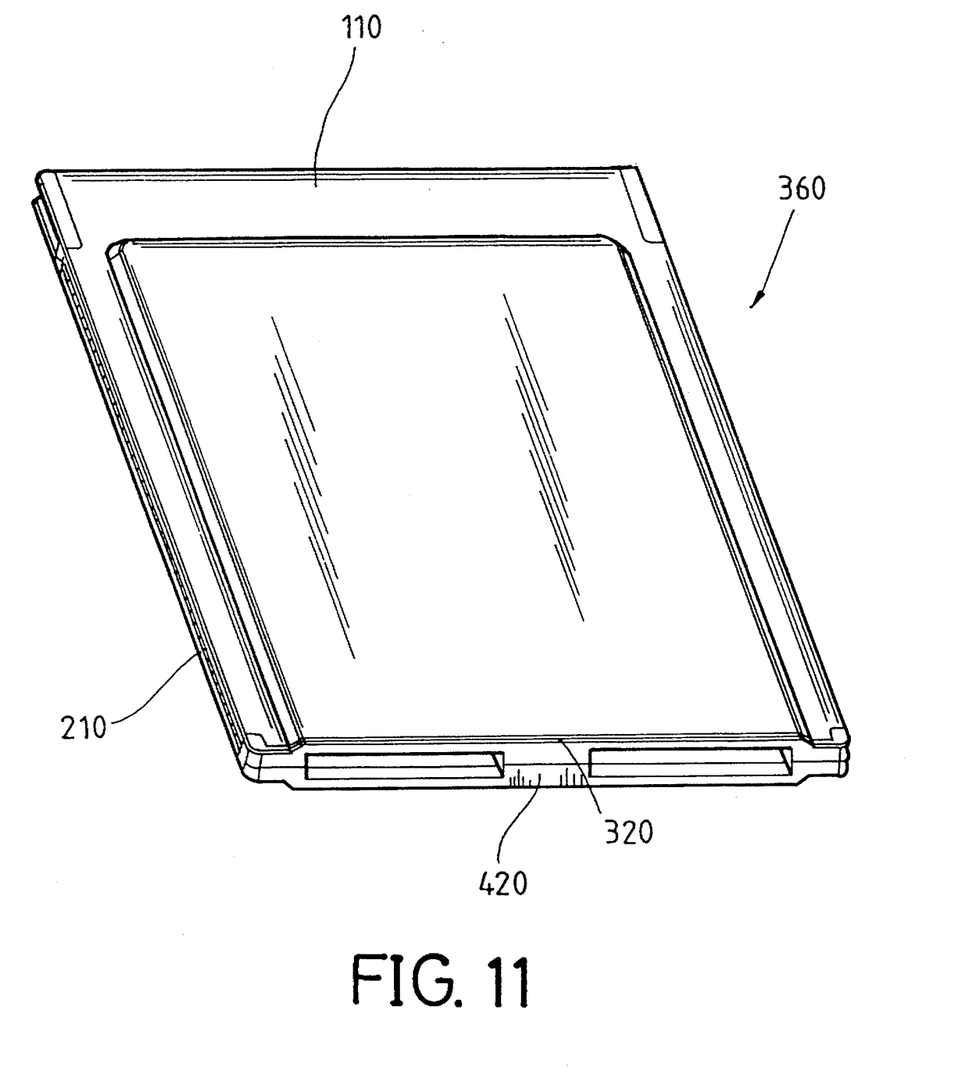
FIG. 11 is a perspective view showing a completed dual connector PCMCIA card.

In FIGS. 7–11, a second example of the present invention is given for manufacturing a dual connector type PCMCIA card, wherein FIGS. 7 and 8 are perspective views of a third frame member and a fourth frame member, respectively, of the dual connector type PCMCIA car, FIGS. 9 and 10 are perspective views of the third and fourth frame members of the dual connector PCMCIA each having the cover member shown in FIG. 1 mounted thereto, and FIG. 11 is a perspective view of the completed dual connector PCMCIA.

The dual connector PCMCIA-card shown in FIGS. 7–11 is manufactured by substantially the same process of the single connector PCMCIA card discussed with reference to FIGS. 1–6. Namely, the process for manufacturing the dual connector type PCMCIA card comprises the following steps:

(1') forming two identical cover members with metal plates, preferably stainless steel plates, as shown in FIG. 1, namely the first cover member 110 and the second cover member 210, each of the cover members 110 and 210 being in the form of a rectangle having two lateral edges on which a flange 111 or 211 is formed with a plurality of inward facing hooks 112 or 212 mounted thereto; preferably, each of the cover members has a recessed portion 113 or 213 extending a substantial distance from a front end of the rectangle to a rear end along the lateral edges, the recessed portion being separated from the rear end and the two lateral edges of the rectangle;

(2') Placing the first and second cover members 110 and 210 respectively into a third mold and a fourth mold (both not shown) to injection mold a third frame member, as shown in FIG. 7 and generally designated with the numeral 320, and a fourth frame member, as shown in FIG. 8 and generally designated with the reference numeral 420, each of the frame members 320 or 420 having a U-shape with two legs 321 or 421 separated a distance suitable to be accommodated between the two edge flanges 111 or 211 of the associated cover member 110 or 210 so as to have the hooks 112 or 212 of the associated cover member 110 or 210 embedded within the legs 321 or 421 during the injection molding process and thus define a third frame/cover sub-assembly as shown in FIG. 9 which is designated with the reference numeral 330 and a second frame/cover sub-assembly as shown in FIG. 10 which is designated with the reference numeral 430; each of the U-shaped frame members 320 and 420 comprises a bottom portion 322 or 422 connecting between the two legs 321 or 421 to form the U-shape and each of the bottom portions 322 and 422 has two notches 323 or 423 formed thereon, corresponding to each other; preferably, the third and fourth frame members 320 and 420 respectively comprise dowel pins 324 and corresponding notches 425 which are engageable with each other;

(3') Disposing a circuit board and associated electronic elements (all not shown in the drawings) between the two sub-assemblies 330 and 430, with two connectors which are generally 15 pin connectors electrically connected to the circuit board received within the two notches 323 or 423 of the sub-assemblies 330 or 430; and (4') Mating the third and fourth sub-assemblies 330 and 430 together by having the dowel pins 324 received within the associated notches 425 to have the notches 323 and 423 that are formed on the bottom portions 322 and 422 of the U-shaped frame members 320 and 420 match each other to define two connector slots for receiving and retaining the connectors therein and securing the two sub-assemblies 330 and 430 together by means of ultra sonic welding or the like to form the completed dual connector type PCMCIA card 360, as shown in FIG. 11.

The PCMCIA card comprises a further connector, which is generally a 86 pin connector retained between the legs of the U-shaped frames 120 and 220 (or 320 and 420) at the opening ends thereof. The 86 pin connector is well known to those skilled in the art and thus is not shown and discussed herein.

The PCMCIA card manufactured by the present invention comprises metal cover members which have no notches formed thereon for retaining therein the 15 pin connectors and the 86 pin connector, the connectors being retained by notches formed on the injection molded frames 120, 220 or 320, 420, so that the cover members so formed may be used to in different PCMCIA cards which are suitable for connectors of different designs. This saves cost of manufacturing and inventory.

The process of present invention provides the cover members with a plurality of hooks which are embedded in the frame members during injection molding so as to tightly secure the cover members on the frame members without any deformation of the cover members. The embedding of the hooks in the frame members also helps tightly securing the cover members on the frame members without any looseness between the cover members and the frame members. This, obviously, increases the reliability and service life of the PCMCIA cards.

It is apparent that although the invention has been described in connection with the preferred embodiments, it is contemplated that those skilled in the art may make changes to the preferred embodiments without departing from the scope of the invention as defined in the appended claims.

What is claimed is:

1. A PCMCIA card manufacturing process comprising the following steps:

(1) providing a first cover member and a second cover member which are identical members made of metal plates, each of the cover members being in the form of a rectangle having two lateral edges on each of which an edge flange is formed with a, plurality of inward facing hooks mounted thereto;

(2) Placing the first and second cover members respectively into a first mold and a second mold to injection mold a first frame member and a second frame member onto the first and second cover members, each of the frame members having a U-shape with two legs separated a distance suitable to be accommodated between the two edge flanges of the associated cover member so as to have the hooks of the associated cover member embedded within the legs during the injection molding process to respectively define a first frame/cover sub-assembly and a second frame/cover sub-assembly, each of the U-shaped frame members comprising a bottom portion connecting between the two legs to form the U-shape and each of the bottom portions having at least a notch formed thereon, corresponding to each other;

(3) Disposing a circuit board and associated electronic elements between the two sub-assemblies with at least a connector which is electrically connected to the circuit board received within the at least one notch formed on one of the sub-assemblies; and (4) Mating the first and second sub-assemblies to have the at least one notch that is formed on each of the bottom portions of the U-shaped frame members match each other to define at least a connector slot for receiving and retaining the connector therein and securing the two sub-assemblies together to form the PCMCIA card.

2. The PCMCIA card manufacturing process as claimed in claim 1, wherein the securing of two sub-assemblies comprises the step of using ultra sonic welding process to joint the two sub-assemblies together.

3. The PCMCIA card manufacturing process as claimed in claim 1, wherein the metal plates comprise stainless steel plates.

4. The PCMCIA card manufacturing process as claimed in claim 1, wherein each of the cover members is provided with a recessed portion extending a substantial distance from a front end of the rectangle to a rear end along the lateral edges, the recessed portion being separated from the rear end and the two lateral edges of the rectangle.

5. The PCMCIA card manufacturing process as claimed in claim 4, wherein one of the first and the second frame members is provided with dowel pins and the other one of the first and second frame members is provided with engageable notches, the step of mating and securing the two sub-assemblies comprising engaging the dowel pins within the notches.

* * * * *

UNITED STATES PATENT AND TRADEMARK OFFICE
CERTIFICATE OF CORRECTION

PATENT NO. : 5,475,919

DATED : December 19, 1995

INVENTOR(S) : Michael WU et al.

It is certified that error appears in the above-indentified patent and that said Letters Patent is hereby corrected as shown below:

Title page: Assignee

Item [73]: change "Three View Technology Co., Ltd." to --3 View Technology Co., Ltd.--

Signed and Sealed this

Twenty-fourth Day of September, 1996

Attest:

BRUCE LEHMAN

Attesting Officer     *Commissioner of Patents and Trademarks*

US005475919B1

REEXAMINATION CERTIFICATE (4175th)

United States Patent [19]
Wu et al.

[11] B1 5,475,919
[45] Certificate Issued Oct. 17, 2000

[54] PCMCIA CARD MANUFACTURING PROCESS

[75] Inventors: Michael Wu; Hank Wang, both of Hsin Chu, Taiwan

[73] Assignee: 3 View Technology Co., Ltd., Hsin Chu, Taiwan

Reexamination Request:
No. 90/005,018, Jun. 15, 1998

Reexamination Certificate for:
Patent No.: 5,475,919
Issued: Dec. 19, 1995
Appl. No.: 08/319,517
Filed: Oct. 7, 1994

Certificate of Correction issued Sep. 24, 1996.

[51] Int. Cl.[7] ....................................................... H05K 3/30
[52] U.S. Cl. ............................ 29/841; 361/716; 361/719; 361/720; 361/721
[58] Field of Search ............................ 29/841; 361/716, 361/719, 720, 721

[56] References Cited

U.S. PATENT DOCUMENTS

| | | |
|---|---|---|
| 5,207,586 | 5/1993 | MacGregor et al. . |
| 5,242,310 | 9/1993 | Leung . |
| 5,330,360 | 7/1994 | Marsh et al. . |
| 5,336,099 | 8/1994 | Aldous et al. . |
| 5,339,222 | 8/1994 | Simmons et al. . |
| 5,397,857 | 3/1995 | Farquhar et al. . |
| 5,476,387 | 12/1995 | Ramey et al. . |

*Primary Examiner*—Carl J. Arbes

[57] ABSTRACT

A PCMCIA card manufacturing process is disclosed, including the steps of (1) providing a top cover and a bottom cover made of a metal, preferably stainless steel, each of the top cover and bottom cover being provided with a plurality of hooks along two opposite lateral edges, (2) placing the top cover and bottom cover respectively into a first mold and a second mode for injection molding a first frame member on the top cover with the hooks of the top cover embedded in the first frame member and a second frame member on the bottom cover with the hooks of the bottom cover embedded in the second frame member, each of the first and second frame member being provided with at least one notch that match each other to define at least a connector slot, (3) disposing a circuit board between the first and second frame members with the connector thereof received within the connector slot, and (4) jointing the first and second members together, preferaby by ultra sonic welding.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 4, between lines 39 and 40:

*The connector is received in the slot defined by the notches 123 and 223 (or 323 and 423) in the respective frame members 120 and 220 (or 320 and 420). As illustrated in the figures, the bottom portion of each U-shaped frame member 120, 220, 320, and 420 includes: (a) a longitudinal direction extending in a direction between the two legs of the U-shaped frame member, (b) a width direction substantially perpendicular to the longitudinal direction of the bottom portion and extending in a longitudinal direction of the two legs, and (c) a thickness direction substantially perpendicular to the width direction and the longitudinal direction of the bottom portion. Moreover, the notches 123, 223, 323, and 423 in each bottom portion: (a) extend only along a portion of the longitudinal direction of the bottom portion, (b) extend only through a portion of the thickness direction of the bottom portion, and (c) extend completely through the width direction of the bottom portion.*

AS A RESULT OF REEXAMINATION, IT HAS BEEN DETERMINED THAT:

Claims 1–5 are cancelled.

\* \* \* \* \*